United States Patent
Huang

(10) Patent No.: US 6,661,258 B1
(45) Date of Patent: Dec. 9, 2003

(54) LOW VOLTAGE DETECTING CIRCUIT FOR DETECTING INPUT POWER OF A MODEM

(75) Inventor: Ying-Chieh Huang, Hsin-Chu (TW)

(73) Assignee: Ambit Microsystems Corp., Hsin-Chu (TW)

( * ) Notice: Subject to any disclaimer, the term of this patent is extended or adjusted under 35 U.S.C. 154(b) by 0 days.

(21) Appl. No.: 10/064,832

(22) Filed: Aug. 21, 2002

(51) Int. Cl.[7] ............................................. H03K 5/153
(52) U.S. Cl. .................................... 327/81; 327/78
(58) Field of Search ............................. 327/54, 78, 77, 327/568, 81, 80

(56) References Cited

U.S. PATENT DOCUMENTS 4,716,323 A * 12/1987 Wada et al. ................ 327/77
6,225,860 B1 * 5/2001 Shimizu et al. ............ 327/568

* cited by examiner

*Primary Examiner*—Dinh T. Le
(74) *Attorney, Agent, or Firm*—Winston Hsu

(57) ABSTRACT

A low voltage detecting circuit includes a first transistor having a first electrode electrically coupled to a reference voltage, a control electrode electrically coupled to the input power voltage, and a second electrode. The low voltage detecting circuit also has a second transistor having a first electrode electrically coupled to a logic high voltage, a control electrode electrically coupled to the second electrode of the first transistor, and a second electrode electrically coupled to a logic low voltage. When the input power voltage drops below the predetermined voltage, the voltage at the control electrode of the first transistor drops below the reference voltage to turn on the first transistor and consequently the second transistor so that a logic low signal is output from the first electrode of the second transistor.

12 Claims, 3 Drawing Sheets

LOW VOLTAGE DETECTING CIRCUIT FOR DETECTING INPUT POWER OF A MODEM

BACKGROUND OF INVENTION

1. Field of the Invention

The present invention relates to a low voltage detecting circuit of an ADSL modem, and more specifically, to a dying gasp circuit for generating a signal when the input power of the modem drops below a predetermined voltage.

2. Description of the Prior Art

A low voltage detecting circuit is used in DSL modems to detect an input power voltage level. More specifically, the low voltage detecting circuit is used for detecting input voltage to generate a low active signal to be sent to a DMT (Discrete Multi-tone) chip in the DSL modem when the input voltage falls below a threshold level. The ADSL modem will inform the central office to ask for disconnection, and the service is then terminated.

Please refer to FIG. 1. FIG. 1 is a low voltage detecting circuit 10 of an ADSL modem according to the prior art. The low voltage detecting circuit 10 comprises a comparator 24 for detecting sufficient input voltage. Non-inverting and inverting input terminals of the comparator 24 are connected to node 16 and node 12, respectively. The low voltage detecting circuit 10 is fed by three voltage sources, which include an input voltage source Vinp and two reference voltage sources Vref1 and Vref2. Resistors R1 and R2 form a voltage divider between the reference voltage source Vref1 and ground, and provide a threshold voltage to the inverting input terminal of the comparator 24 at node 12. Likewise resistors R3, R4 and R7, R8 form a voltage divider between the input voltage source Vinp and ground, and provide a fraction of the input voltage to the non-inverting input terminal of the comparator 24 at node 16. An output terminal of the comparator 24 is connected to a discrete multi-tone (DMT) chip 22 at node 20.

The low voltage detecting circuit 10 performs a simple function. The comparator 24 is used to compare the threshold voltage at node 12 to the fraction of the input voltage from input voltage source Vinp at node 16. If the input voltage drops, such that voltage at node 16 is less than the threshold voltage at node 12, then the comparator 24 outputs a low voltage signal at node 20. When the DMT chip 22 receives this low voltage signal at node 20, it sends the information to the central office (CO) and the ADSL modem will then be disconnected.

Although simple in function, the low voltage detecting circuit 10 uses the comparator 24 to generate the low voltage signal that is used to request disconnection of the ADSL modem. The comparator 24 is a complicated circuit that takes many logic gates to realize. Thus, the use of the comparator 24 adds size and expense of the low voltage detecting circuit 10.

SUMMARY OF INVENTION

It is therefore a primary objective of the claimed invention to provide a low voltage detecting circuit that uses two transistors instead of a comparator for detecting a drop of an input power voltage of a modem below a predetermined voltage.

According to the claimed invention, a low voltage detecting circuit comprises a first transistor having a first electrode electrically coupled to a reference voltage, a control electrode electrically coupled to the input power voltage, and a second electrode. The low voltage detecting circuit also has a second transistor having a first electrode electrically coupled to a logic high voltage, a control electrode electrically coupled to the second electrode of the first transistor, and a second electrode electrically coupled to a logic low voltage. When the input power voltage drops below the predetermined voltage, the voltage at the control electrode of the first transistor drops below the reference voltage to turn on the first transistor and consequently the second transistor so that a logic low signal is output from the first electrode of the second transistor.

It is an advantage of the claimed invention that the low voltage detecting circuit uses two transistors instead of a comparator in order to make the low voltage detecting circuit smaller and less expensive.

These and other objectives of the claimed invention will no doubt become obvious to those of ordinary skill in the art after reading the following detailed description of the preferred embodiment, which is illustrated in the various figures and drawings.

DETAILED DESCRIPTION

Figure 1:
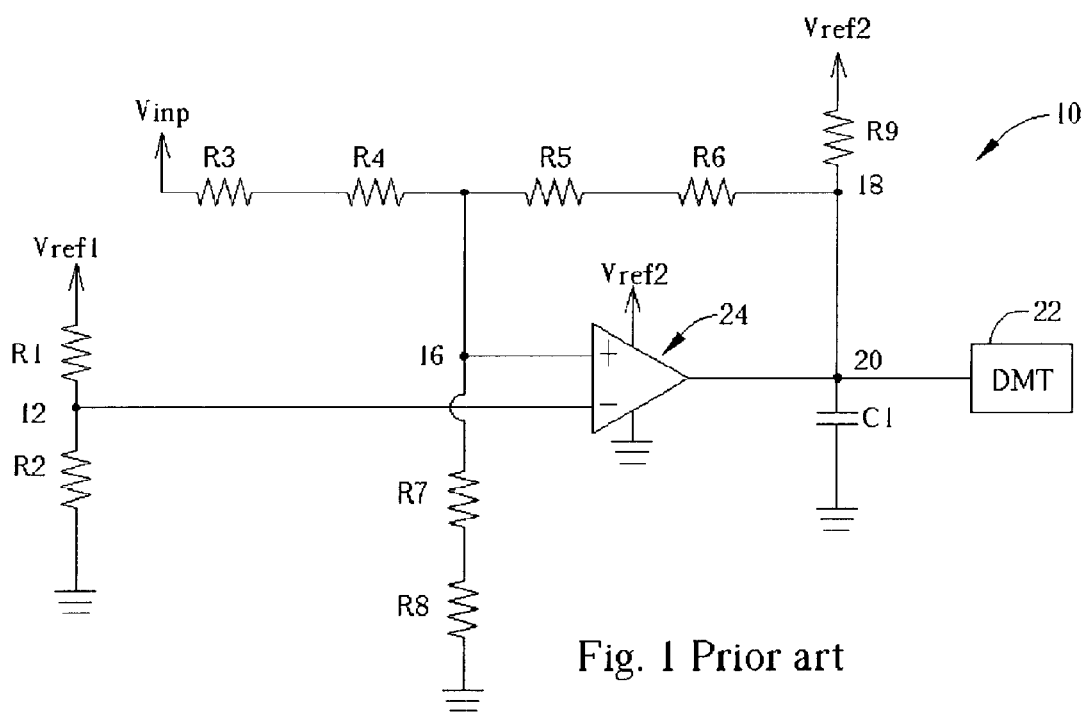
FIG. 1 is a low voltage detecting circuit of an ADSL modem according to the prior art.
Figure 2:
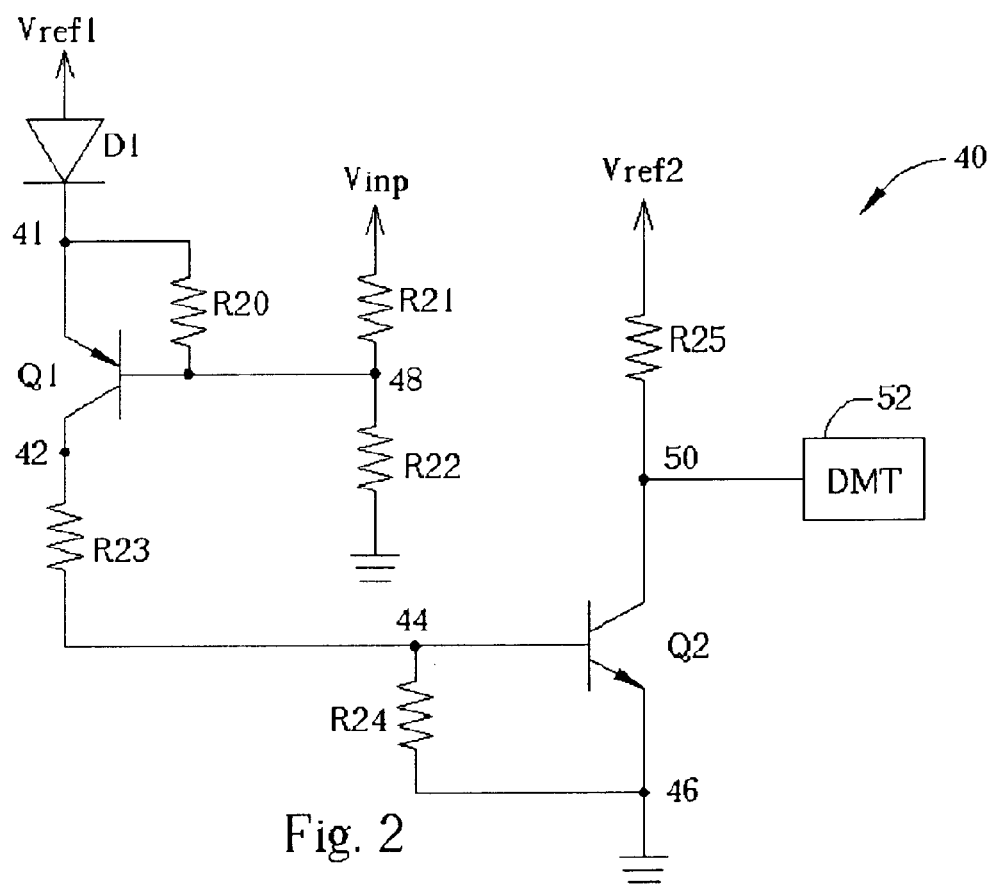
FIG. 2 is a low voltage detecting circuit of an ADSL modem according to the present invention.

Please refer to FIG. 2. FIG. 2 is a low voltage detecting circuit 40 of an ADSL modem according to the present invention. The low voltage detecting circuit 40 uses two transistors Q1 and Q2 to perform the same function as the comparator 24 of the prior art low voltage detecting circuit 10. Transistors Q1 and Q2 are preferably bi-polar junction transistors (BJTs), but can also be MOS transistors. As shown in FIG. 2, transistor Q1 is a pnp BJT and transistor Q2 is a npn BJT.

The low voltage detecting circuit 40 is fed by three voltage sources, which include an input voltage source Vinp and two reference voltage sources Vref1 and Vref2. Reference voltage source Vref2 is used as a logic high voltage source, and can have the same voltage value as the reference voltage source Vref1. A diode D1 is connected between reference voltage source Vref1 and node 41 for preventing the reverse current from passing from Vinp to voltage source Vref1 through resistors R21 and R20 to thereby protect the reference voltage source Vref1, and node 41 is also connected to an emitter of the transistor Q1. A resistor R20 is connected between the emitter of the transistor Q1 at node 41 and a base of the transistor Q1 at node 48. Furthermore, resistors R21 and R22 form a voltage divider between the input voltage source Vinp and ground, and provide a fraction of the input voltage to the base of transistor Q1 at node 48.

A collector of the transistor Q1 is connected to a resistor R23 at node 42, and the resistor R23 is also connected to a base of transistor Q2 at node 44. A resistor R24 is connected between the base of the transistor Q2 at node 44 and an emitter of the transistor Q2 at node 46, which is grounded. A collector of the transistor Q2 is connected to a discrete multi-tone (DMT) chip 52 at node 50. Finally, a resistor R25 is connected between the reference voltage source Vref2 at node 50.

The advantage of the low voltage detecting circuit 40 is that only two transistors Q1 and Q2 are needed to properly detect a low input voltage coming from the input voltage source Vinp. The reference voltage source Vref1 provides a reference voltage to the emitter of transistor Q1 at node 41. Furthermore, the voltage divider made up of resistors R21 and R22 provides a reduced value of the voltage from the input voltage source Vinp to the base of the transistor Q1 at node 48. Therefore, when the voltage level at node 48 is less than the voltage level at node 41, transistor Q1 turns on. When transistor Q1 turns on, this signifies that the input voltage source Vinp is providing a voltage that is too low for operation of the ADSL modem. Transistor Q1 turning on causes the transistor Q2 to turn on as well. Then, the collector of the transistor Q2 outputs a logic low signal to node 50. Finally, the DMT chip 52 receives this logic low signal at node 50, and uses this information to ask for disconnection of the ADSL modem.

Compared to the prior art, the low voltage detecting circuit 40 uses only two transistors Q1 and Q2 to perform the same function as the comparator 24 of the prior art low voltage detecting circuit 10. Thus, the low voltage detecting circuit 40 is realized with simpler logic, and is smaller and less expensive to manufacture.

Figure 3:
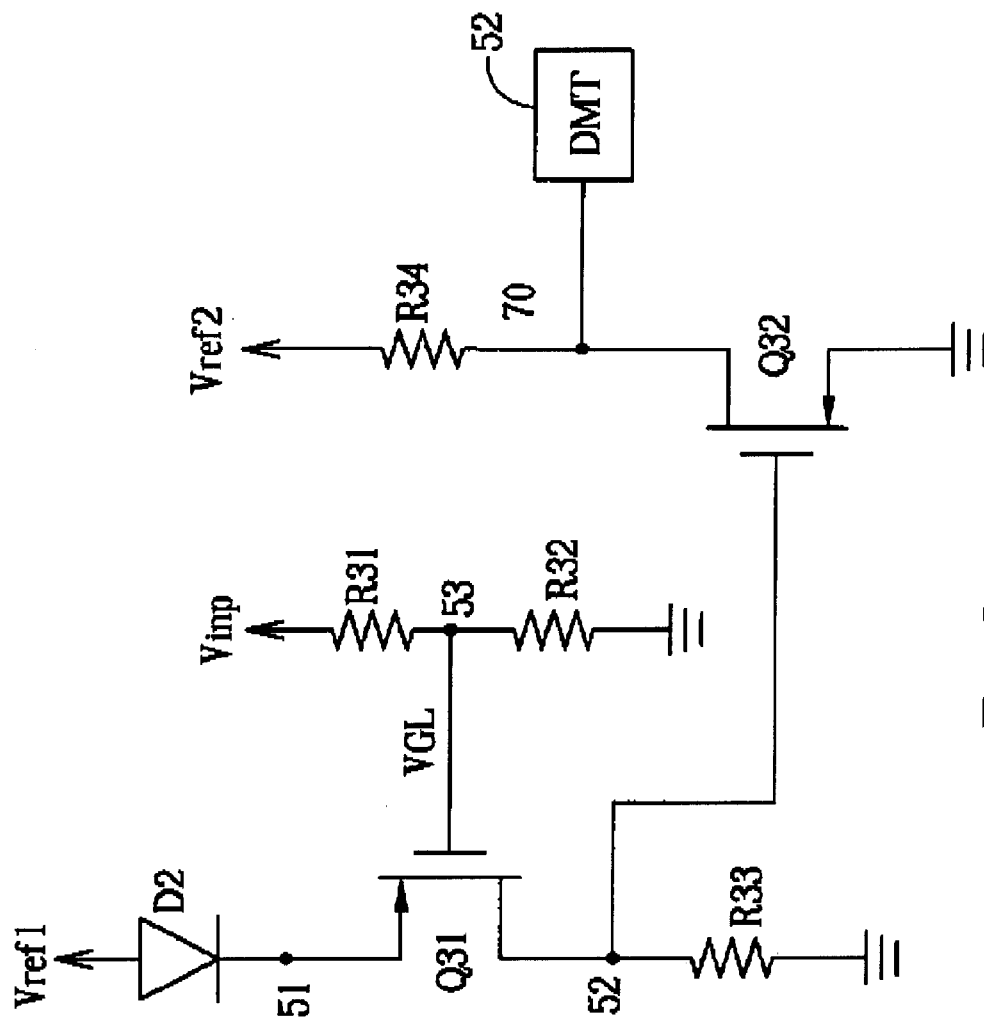
FIG. 3 is another low voltage detecting circuit of an ADSL modem according to the present invention.

Please refer to FIG. 3. As is well known in the art, MOS transistors can replace BJT transistors Q1 and Q2. In this case, a PMOS transistor Q31 can replace transistor Q1, and an NMOS transistor Q32 can replace transistor Q2. Operation of the low voltage detecting circuit 40 remains the same with BJT or MOS transistors.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A low voltage detecting circuit for detecting a drop of an input power voltage of a modem below a predetermined voltage, the low voltage detecting circuit comprising:

a first transistor having a first electrode electrically coupled to a reference voltage, a control electrode electrically coupled to the input power voltage, and a second electrode; and a second transistor having a first electrode electrically coupled to a logic high voltage, a control electrode electrically coupled to the second electrode of the first transistor, and a second electrode electrically coupled to a logic low voltage;

wherein when the input power voltage drops below the predetermined voltage, the voltage at the control electrode of the first transistor drops below the reference voltage to turn on the first transistor and consequently the second transistor so that a logic low signal is output from the first electrode of the second transistor.

2. The low voltage detecting circuit of claim 1 wherein the reference voltage and the logic high voltage are substantially the same.

3. The low voltage detecting circuit of claim 1 wherein the logic low voltage electrically coupled to the second electrode of the second transistor is a ground.

4. The low voltage detecting circuit of claim 1 further comprising a resistor electrically coupled between the logic high voltage and the first electrode of the second transistor.

5. The low voltage detecting circuit of claim 1 wherein the first transistor is a pnp BJT (bi-polar junction transistor), and the second transistor is an npn BJT.

6. The low voltage detecting circuit of claim 5 wherein the first electrode of the first transistor is an emitter of the pnp BJT, the control electrode of the first transistor being a base of the pnp BJT, the second electrode of the first transistor being a collector of the pnp BJT, the first electrode of the second transistor being a collector of the npn BJT, the control electrode of the second transistor being a base of the npn BJT, the second electrode of the second transistor being an emitter of the npn BJT.

7. The low voltage detecting circuit of claim 1 wherein the first transistor is a PMOS transistor, and the second transistor is an NMOS transistor.

8. The low voltage detecting circuit of claim 7 wherein the first electrode of the first transistor is a source of the PMOS transistor, the control electrode of the first transistor being a gate of the PMOS transistor, the second electrode of the first transistor being a drain of the PMOS transistor, the first electrode of the second transistor being a drain of the NMOS transistor, the control electrode of the second transistor being a gate of the NMOS transistor, the second electrode of the second transistor being a source of the NMOS transistor.

9. The low voltage detecting circuit of claim 1 wherein the first electrode of the second transistor is electrically coupled to a DMT (discrete multi-tone) chip of the modem to supply the logic low signal thereto.

10. A low voltage detecting circuit for detecting a drop of an input power voltage of a modem below a predetermined voltage, the low voltage detecting circuit comprising:

a first transistor having a first electrode electrically coupled to a reference voltage, a control electrode electrically coupled to the input power voltage, and a third electrode;

a second transistor having a first electrode, a control electrode electrically coupled to the second electrode of the first transistor, and a second electrode electrically coupled to a logic low voltage; and a resistor electrically coupled between a logic high voltage and the first electrode of the second transistor;

wherein when the input power voltage drops below the predetermined voltage, the voltage at the control electrode of the first transistor drops below the reference voltage to turn on the first transistor and consequently the second transistor so that a logic low signal is output from the first electrode of the second transistor.

11. The low voltage detecting circuit of claim 10 wherein the first transistor is a p-type transistor and the second transistor is an n-type transistor.

12. The low voltage detecting circuit of claim 11 wherein the p-type transistor is a PMOS transistor, and the n-type transistor is an NMOS transistor.

* * * * *